United States Patent [19]

Lee

[11] Patent Number: 5,498,566

[45] Date of Patent: Mar. 12, 1996

[54] ISOLATION REGION STRUCTURE OF SEMICONDUCTOR DEVICE AND METHOD FOR FABRICATING THE SAME

[75] Inventor: Chang J. Lee, Chungcheongbuk, Rep. of Korea

[73] Assignee: LG Semicon Co., Ltd., Seoul, Rep. of Korea

[21] Appl. No.: 494,938

[22] Filed: Jun. 26, 1995

Related U.S. Application Data

[63] Continuation of Ser. No. 152,976, Nov. 15, 1993, abandoned.

[51] Int. Cl.$^6$ ................................................. H01L 21/76
[52] U.S. Cl. ............................ 437/67; 437/69; 437/72; 148/DIG. 50
[58] Field of Search ........................... 437/67, 72, 69, 437/70; 148/DIG. 50

[56] References Cited

U.S. PATENT DOCUMENTS

| | | | |
|---|---|---|---|
| 4,238,278 | 12/1980 | Antipov | 437/67 |
| 4,666,556 | 5/1987 | Fulton et al. | 437/72 |
| 4,766,090 | 8/1988 | Coquin et al. | 437/63 |
| 4,892,614 | 1/1990 | Chapman et al. | 156/643 |
| 4,960,727 | 10/1990 | Mattox et al. | 437/67 |
| 4,980,747 | 12/1990 | Hutter et al. | 357/48 |
| 4,983,226 | 1/1991 | Hunter et al. | 148/DIG. 50 |
| 5,011,788 | 4/1991 | Kawasi et al. | 437/72 |

OTHER PUBLICATIONS

Wolf; "Silicon Processing For The VLSI Era", vol. 1, Process Technology, Lattice Press, 1986, pp. 177–178.

*Primary Examiner*—Brian E. Hearn
*Assistant Examiner*—Trung Dang
*Attorney, Agent, or Firm*—Morgan, Lewis and Bockius

[57] ABSTRACT

An isolation region structure of a semiconductor device and a method for fabricating the same using both a buried oxide isolation technique and a local oxidation of silicon technique, thereby capable of having an advantage of high integrity. In the isolation region structure, narrow trenches are filled only with a polysilicon film whereas wide trenches are filled with a field oxide film and a polysilicon film so as to isolate adjacent active regions from each other. The isolation region structure includes a plurality of trenches including narrow ones and wide ones formed in the silicon substrate, a thin oxide film formed on a bottom surface and opposite side surfaces of each of the narrow trenches and opposite side surfaces of each of the wide trenches, a thick field oxide film formed on a bottom surface of each of the wide trenches, a thin nitride film formed to cover the entire surface of a portion of the thin oxide film disposed in each of the narrow trenches, opposite side surfaces of a portion of the thin oxide film disposed in each of the wide trenches and opposite edges of a portion of the thick field oxide film disposed in each of the wide trenches, a polysilicon film filling the narrow trenches and the wide trenches, another thick field oxide film formed over the polysilicon film, and a thin pad oxide film formed over the active regions.

11 Claims, 10 Drawing Sheets

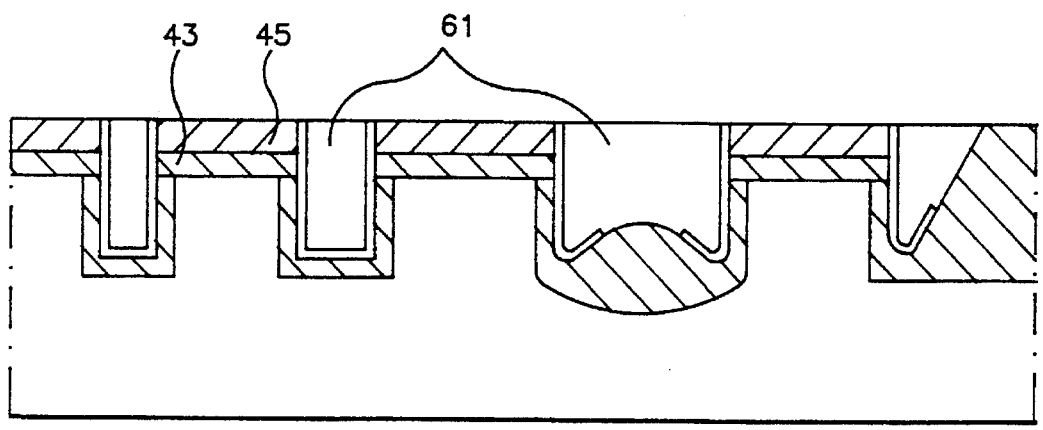
F I G.5h
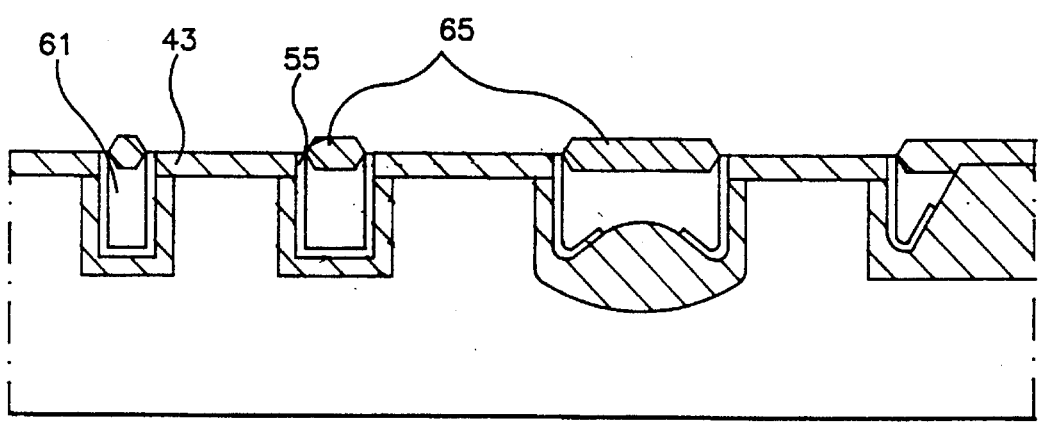
F I G.5i

ISOLATION REGION STRUCTURE OF SEMICONDUCTOR DEVICE AND METHOD FOR FABRICATING THE SAME

CROSS-REFERENCE TO RELATED APPLICATION

This is a continuation of application Ser. No. 08/152,976, filed Nov. 15, 1993, now abandoned.

BACKGROUND OF THE INVENTION

The present invention relates to a semiconductor device having an advantage of high integrity, and more particularly to an isolation region structure of such a semiconductor device and a method for fabricating the same using both a buried oxide isolation technique and a local oxidation of silicon technique.

Local oxidation of silicon (LOCOS) techniques have been used for isolating adjacent active regions from each other in LSI and VLSI integration of MOS transistors. In accordance with such LOCOS techniques, a thin pad oxide film is interposed between a silicon substrate and a nitride film as an oxidation mask so as to relieve a stress generated due to the thermal characteristic difference between the silicon substrate and the nitride film.

However, such LOCOS techniques involve not only a vertical growth of a field oxide film in field oxidation, but also a lateral diffusion of an oxidant through the stress-relief pad oxide film. As a result, the field oxide film is laterally grown beneath an edge of the nitride film as the oxidation mask.

Due to such a lateral growth, the field oxide film encroaches on an active region, resulting in a decrease of the active region.

Such a phenomenon that the field oxide film encroaches on the active region is called a bird's beak. Such a bird's beak has a length coming up to ½ of the thickness of the field oxide film.

For reducing the length of the bird's beak causing a damage of the active region, the thickness of the field oxide film should be reduced. However, such a reduction in the thickness of the field oxide film results in an increase in capacitance between the substrate and each of interconnection lines on a chip. As a result, an IC characteristic is degraded.

Furthermore, the threshold voltage $V_T$ of a parasitic field transistor is decreased, resulting in an increase in leakage current at a region beneath the field oxide film. As a result, an insulating characteristic between adjacent active regions is degraded.

In actual, the method for decreasing the length of bird's beak by decreasing the thickness of the field oxide film is improper as a practical insulating method.

As a result, researches have been made for inhibiting the growth of bird's beak and thus reducing the length of bird's beak without decreasing the thickness of the field oxide film.

One of the methods for inhibiting the growth of bird's beak without decreasing the thickness of the field oxide film is a field oxidation method wherein a pad oxide film is sealed by a nitride film as an oxidation mask formed over the pad oxide film and a nitride film formed in the form of side walls on the side surfaces of the pad oxide film.

As the next generation isolation techniques, there have been known a polysilicon buffered LOCOS isolation using a polysilicon as a stress-buffered layer, a side wall masked isolation (SWAMI) and a sealed-interface LOCOS (SILO) isolation. In addition, the buried oxide (BOX) isolation has been known.

Isolation techniques applicable to devices requiring a high integrity should satisfy the following requirements.

First, an isolation region should have a planar surface. This is for the purpose of solving a problem related to an aspect ratio due to a reduction in lateral dimension of a device finally produced and thereby obtaining a superior pattern limitation characteristic.

Second, a crystal defect should not occur in a bulk of a field region adjacent to an edge portion of an active region;

Third, a zero bird's beak should be produced so as to obtain maximized active regions.

The BOX isolation technique is the isolation technique capable of satisfying the above-mentioned requirements.

Generally, the BOX isolation technique includes the steps of growing a stress-relief oxide film on a silicon substrate, depositing a nitride film over the oxide film, patterning the nitride film and the oxide film to define an active region and a field region, etching a portion of the silicon substrate corresponding to the field region by use of a photolithograpy to form a trench, filling the trench with a CVD oxide film, coating a photoresist film over the resulting structure, and etching back the photoresist film and the CVD oxide film to planarize the surface of the oxide film.

The reason why the photoresist film is coated and then etched back is to planarize the surface of the CVD oxide film filling the trench.

In other words, when the CVD oxide film is deposited to fill the trench, it gets depressed at its portion positioned over the trench having a large width, thereby causing its surface to be uneven. The surface of the CVD oxide film is planarized by use of the photoresist film.

Although the BOX isolation method has advantages of a bird's beak of zero and a planar surface of an isolation region, it encounters the following problems.

First, it involves complex process steps because a photolithograpy process step is carried out twice for achieving the step of forming the trench and the step of planarizing the CVD oxide film.

Second, the surface-planarizing photoresist film may be coated to a non-uniform thickness, depending on a pattern density. As a result, the photoresist film has a smaller thickness at a highly dense region. This requires a critical resist etchback process step. In other words, since the CVD oxide film and the photoresist film are non-uniform in thickness, the surface of the CVD oxide film can not be completely planarized. Upon the etching, the surface of the active region may be considerably damaged.

As an isolation technique capable of obtaining a planar surface without encroaching on the active region and by use of a single photolithography process step, there has been proposed an isolation method wherein adjacent active regions are isolated from each other by use of the LOCOS isolation technique where a large space is defined between adjacent active regions and by use of the BOX isolation technique where a small space (a narrow trench) is defined between adjacent active regions. This method using the LOCOS isolation technique and the BOX isolation technique together has been disclosed in U.S. Pat. No. 4,892,614.

FIGS. 1A to 1H are sectional views respectively illustrating a conventional method for fabricating isolation regions of a semiconductor device by use of both the LOCOS isolation technique and the BOX isolation technique.

In accordance with this method, a thermal oxide film 12 is grown over a silicon substrate 10, as shown in FIG. 1A. A nitride film 14 is then deposited over the thermal oxide film 12 by use of a low pressure chemical vapor deposition (LPCVD) process. A photoresist film 16 is coated over the nitride film 14 and then patterned to define active regions 18. Using the patterned photoresist film 16 as a mask, the nitride film 14 and the oxide film 12 are etched and the silicon substrate 10 is etched so as to form a trench structure including a plurality of trenches 20a to 20d. Each of trenches 20a and 20b has a relatively small width, thereby defining a narrow isolation space between adjacent active regions 18. On the other hand, each of trenches 20c and 20d has a relatively small width, thereby defining a wide isolation space between adjacent active regions 18. In FIG. 1A, the reference numeral 21 denotes corners of each trench.

Thereafter, the photoresist film 16 remaining over the active regions 18 is completely removed, as shown in FIG. 1B. A second thermal oxide film 22 is then grown again over portions of the silicon substrate 10 exposed due to the formation of the trench structure. This thermal oxide film 22 serves to form each corner 21 of each trench into a slightly round shape, as compared with the structure of FIG. 1A.

Over the entire exposed surface of the resulting structure, a second nitride film 24 is deposited, as shown in FIG. 1C. An oxide film 26 having a large thickness is deposited over the second nitride film 24 by use of the CVD process. The oxide film 26 is thickly deposited such that it fills the narrow trenches 20a and 20b sufficiently, but fills the wide trenches 20c and 20d insufficiently. As a result, small depressions 27a are formed at the surface portion of the oxide film 26 over the narrow trenches 20a and 20b, respectively. On the other hand, deep depressions 27b are formed at the surface portion of the oxide film 26 over the wide trenches 20c and 20d, respectively.

Subsequently, an anisotropic etching step is carried out for forming side walls of each trenches, as shown in FIG. 1D. At the anisotropic etching step, respective portions of the CVD-oxide film 26, the nitride film 24 and the thermal oxide film 22 disposed beneath the deep depressions 27b at the wide trenches 20c and 20d are etched. As a result, the silicon substrate 10 is exposed at its portions respectively disposed in the trenches 20c and 20d. Also, each of the trenches 20c and 20d has side wall oxide films 28. Of course, each of the narrow trenches 20a and 20b also has side wall oxide films 28. In this case, however, the side wall oxide films 20 are formed to fill the trench completely. As a result, the nitride film 24 is not etched.

Then, a field oxidation step is carried out for forming a field oxide film, as shown in FIG. 1E. At the field oxidation step, all the side wall oxide films 28 of the trench structure are removed. Formation of a field oxide film 30 is achieved by use of the LOCOS process. At this time, the field oxide film 30 is not grown in the narrow trenches 20a and 20b because the silicon substrate 10 is covered with the nitride film 24 in the narrow trenches 20a and 20b. However, the field oxide film 30 is grown over the silicon substrate 10 in the wide trenches 20c and 20d. In the wide trenches 20c and 20d, the field oxide film 30 is further grown over the edge portions of the nitride film 24, thereby forming bird's beaks 31. In spite of such bird's beaks 31, however, the active regions 18 are not reduced in dimension. This is because the bird's beaks 31 are not grown up to areas over active regions 18.

Thereafter, the nitride films 14 and 24 are dipped in a hot phosphoric acid solution so as to be completely removed, as shown in FIG. 1F. A CVD oxide film 32 is thickly coated over the entire exposed surface of the resulting structure to fill all the trenches and have a planar surface.

The CVD oxide film 32 is then etched back to provide a planar surface, as shown in FIG. 1G.

Over the entire exposed surface of the resulting structure, a third thermal oxide film 34 as a gate oxide film is then formed to obtain isolation regions for isolating active regions 18, as shown in FIG. 1H. The isolation regions have the BOX structure constituted by the CVD oxide film 32 formed in each of the narrow trenches 20a and 20b and the LOCOS structure constituted by the field oxide film 30 formed in the wide trenches 20c and 20d and the CVD oxide film 32 covering over the edge portions of the field oxide film 30.

In other words, the isolation between the active regions 18 at each of the narrow trenches 20a and 20b is achieved in accordance with the BOX isolation technique. At each of the wide trenches 20c and 20d, the isolation between the active regions 18 is achieved in accordance with a combination of the BOX isolation technique and the LOCOS isolation technique.

Accordingly, it can be understood that the method for fabricating isolation regions of a semiconductor device by utilizing both the LOCOS isolation technique and the BOX isolation technique is the isolation technique capable of satisfying the requirements involved in high integration of the semiconductor device, namely, a planar surface, a zero bird's beak, and a simple planarization using a single photolithography process step for trench formation.

In accordance with the above-mentioned method, however, when the CVD oxide film 32 fills the trenches 20 formed in the silicon substrate 10, the filling of CVD oxide film 32 may be incompletely achieved in cases of narrow and deep trenches, thereby forming voids. For preventing such a formation of voids, it is necessary to carry out the deposition of the CVD oxide film 32 at a high temperature of 750° to 800° C. However, such a heat cycle involves a problem of a crystal defect occurring at lower edge portions 21 of the trench structure.

Since the CVD oxide film 32 fills the trench structure, a stress may be applied to the silicon substrate 10 due to a thermal reaction difference (thermal expansion coefficient difference) between the silicon substrate 10 and the CVD oxide film 32 at the heat cycle process step following the formation of isolation regions. As a result, a crystal defect may occur.

Furthermore, the CVD oxide film 32 filling the trench structure exhibits a high etch rate in an HF solution. As a result, the CVD oxide film 32 may be greatly damaged when it is subjected to a cleaning at subsequent process steps following the formation of isolation regions.

SUMMARY OF THE INVENTION

Therefore an object of the invention is to provide an isolation region structure of a semiconductor device and a method for fabricating the same, capable of solving the above-mentioned problems encountered in use of CVD oxide film by filling trenches with polysilicon.

In accordance with one aspect, the present invention provides in a semiconductor device having a silicon substrate and active regions defined at the silicon substrate, an isolation region structure for isolating adjacent ones of the active regions, comprising: a plurality of trenches including narrow ones and wide ones formed in said silicon substrate; a first insulating film formed on a bottom surface and opposite side surfaces of each of said narrow trenches and opposite side surfaces of each of said wide trenches, said first insulating film having a small thickness; a second insulating film formed on a bottom surface of each of the wide trenches, said second insulating film having a large thickness; a third insulating film formed to cover the entire surface of a portion of said first insulating film disposed in each of the narrow trenches, opposite side surfaces of a portion of the first insulating film disposed in each of the wide trenches and opposite edges of a portion of said second insulating film disposed in each of the wide trenches, said third insulating film having a small thickness; a semiconductor film filling the narrow trenches and the wide trenches; a fourth insulating film formed over said semiconductor film, said fourth insulating film having a large thickness; and a fifth insulating film formed over said active regions, said fifth insulating film having a small thickness.

In accordance with another aspect, the present invention provides a method for fabricating an isolation region structure in a semiconductor device, comprising the steps of: sequentially forming a first pad oxide film and a first nitride film over a silicon substrate; patterning said first nitride film and said first pad oxide film to expose said silicon substrate at its portion not disposed at active regions; etching said exposed portion of the silicon substrate to form a plurality of trenches including narrow ones and wide ones; forming a second pad oxide film on a bottom surface and opposite side surfaces of each of said trenches; forming a second nitride film over the entire exposed surface of the resulting structure; depositing an oxide film over said second nitride film and etching back said oxide film such that said oxide film remains to fill said narrow trenches and form spacers respectively on side walls of said wide trenches while the silicon substrate is exposed at its portions respectively disposed in the wide trenches; dipping the remaining oxide film in a HF solution to remove it; growing a first field oxide film over said exposed portions of the silicon substrate in the wide trenches by use of a primary field oxidation process; thickly forming a polysilicon film over the entire exposed surface of the resulting structure to fill all the trenches with said polysilicon film; etching the polysilicon film such that said polysilicon film remains to fill the narrow and wide trenches completely; forming a second field oxide film over the polysilicon film by use of a secondary field oxidation process; and removing the nitride film remaining the first pad oxide film at said active regions.

BRIEF DESCRIPTION OF THE DRAWINGS

Other objects and aspects of the invention will become apparent from the following description of embodiments with reference to the accompanying drawings in which:

FIGS. 5A to 5I are sectional views respectively illustrating a method for fabricating the isolation region structure of FIG. 3.

DETAILED DESCRIPTION OF THE PREFERRED EMBODIMENTS

Figure 1A:
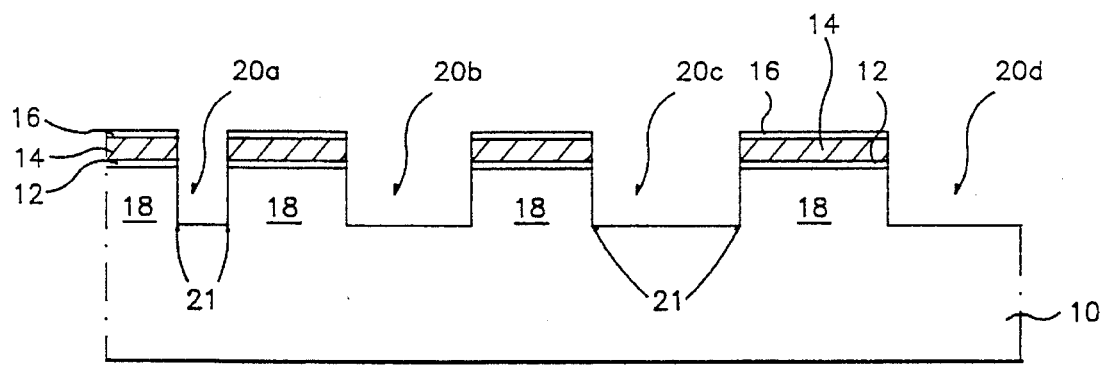
FIGS. 1A to 1H are sectional views respectively illustrating a conventional method for fabricating isolation regions of a semiconductor device.
Figure 1B:
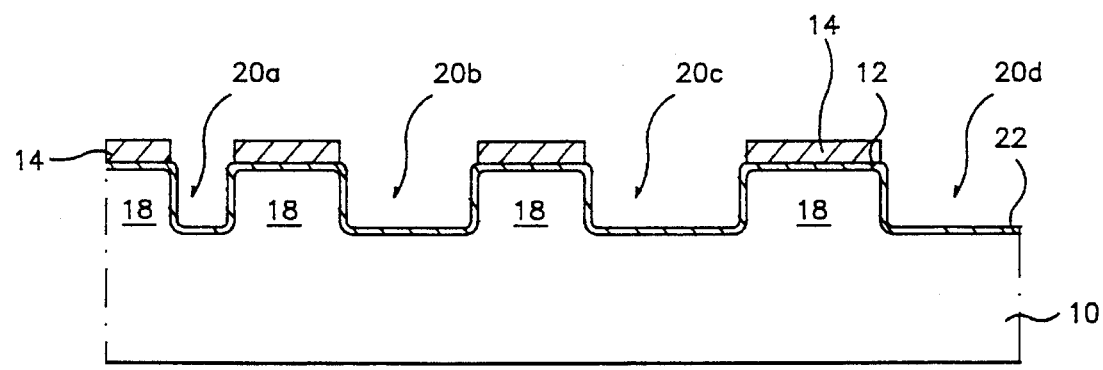
Figure 1C:
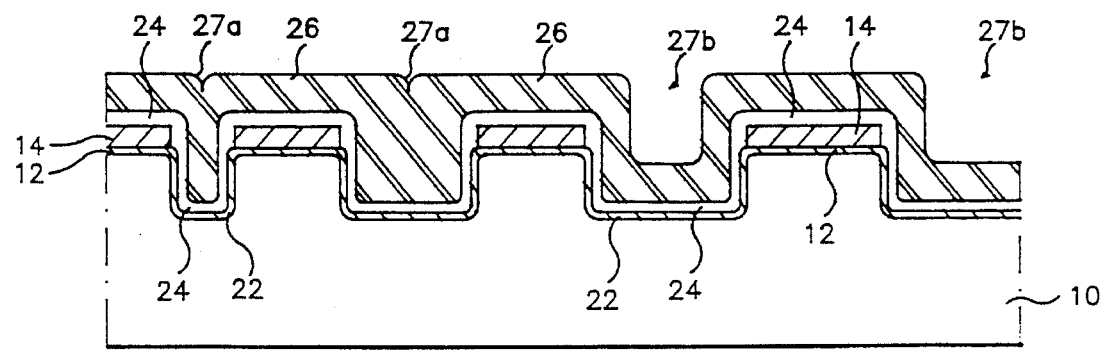
Figure 1D:
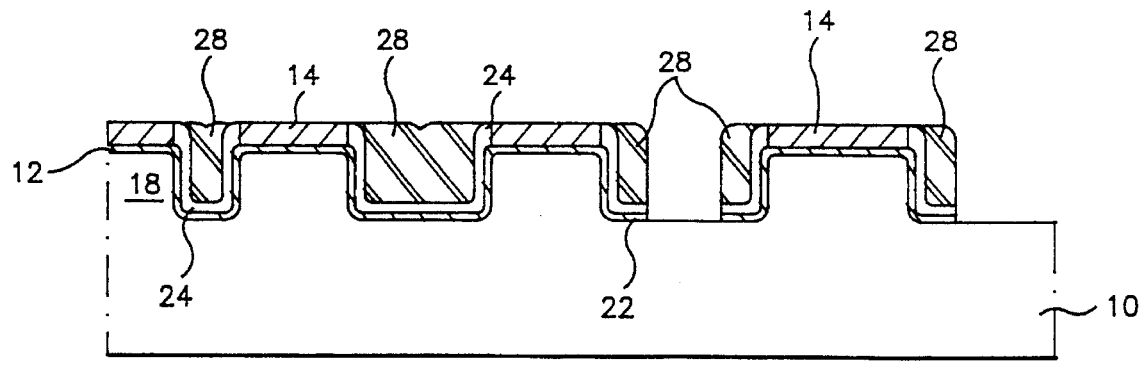
Figure 1E:
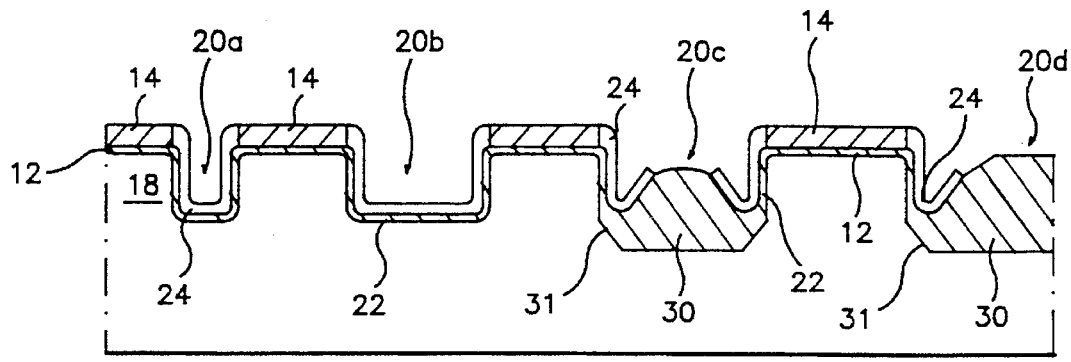
Figure 1F:
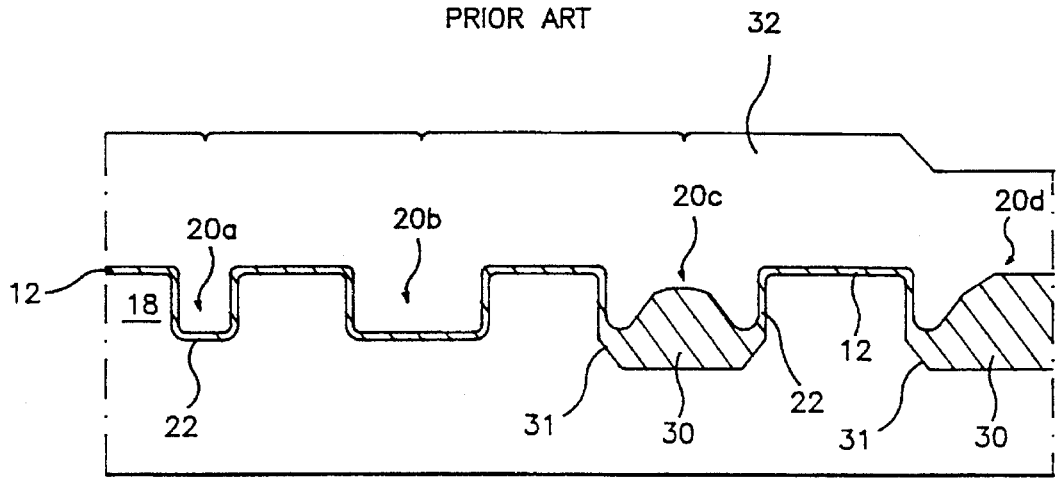
Figure 1G:
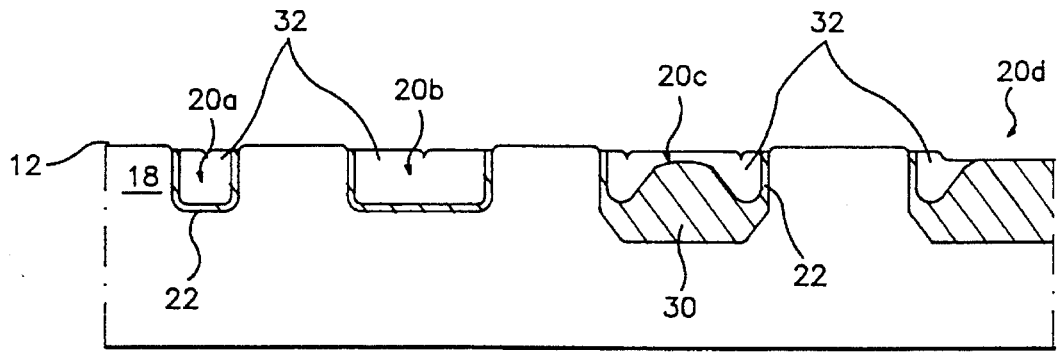
Figure 1H:
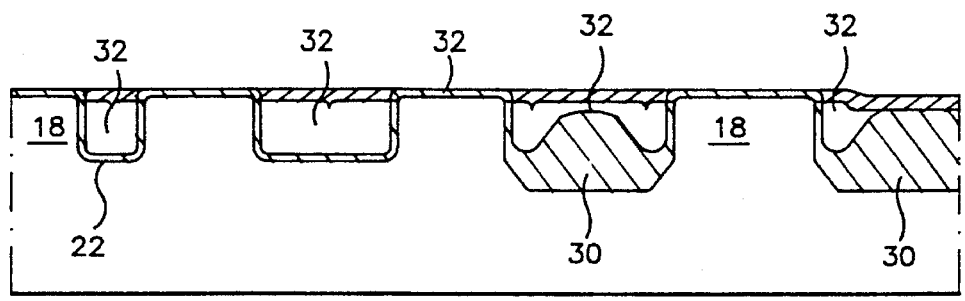
Figure 2:
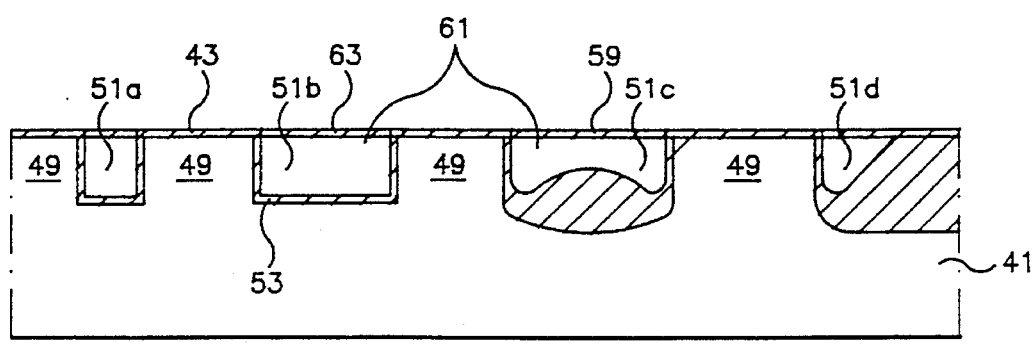
FIG. 2 is a sectional view illustrating an isolation region structure of a semiconductor device in accordance with a first embodiment of the present invention.

FIG. 2 is a sectional view illustrating an isolation region structure of a semiconductor device in accordance with a first embodiment of the present invention.

As shown in FIG. 2, the isolation region structure includes a plurality of trenches including narrow ones 51a and 51b and wide ones 51c and 51d formed in the silicon substrate 41, an oxide film 53 formed on the bottom surface and opposite side surfaces of each of the narrow trenches 51a and 51b and opposite side surfaces of each of the wide trenches 51c and 51d, and a field oxide film 59 formed on the bottom surface of each of the wide trenches 51c and 51d. The isolation region structure further includes a polysilicon film 61 filling the narrow trenches 51a and 51b and the wide trenches 51c and 51d, an oxide film 43 formed over active regions 49, and a thin oxide film 63 formed over the polysilicon film 61 to protect the polysilicon film 61.

In this structure, the narrow trenches 51a and 51b are filled only with the polysilicon film 61 whereas the wide trenches 51c and 51d are filled with the field oxide film 59 and the polysilicon film 61 so as to isolate adjacent active regions from each other.

Figure 3:
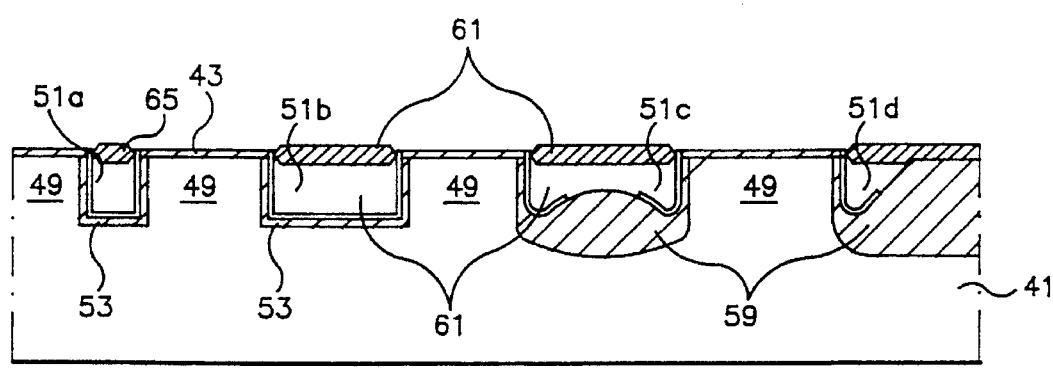
FIG. 3 is a sectional view illustrating an isolation region structure of a semiconductor device in accordance with a second embodiment of the present invention.

FIG. 3 is a sectional view illustrating an isolation region structure of a semiconductor device in accordance with a second embodiment of the present invention. In FIG. 3, elements corresponding to those in FIG. 2 are denoted by the same reference numerals.

As shown in FIG. 3, the isolation region structure includes a plurality of trenches including narrow ones 51a and 51b and wide ones 51c and 51d formed in the silicon substrate 41, an oxide film 53 formed on the bottom surface and opposite side surfaces of each of the narrow trenches 51a and 51b and opposite side surfaces of each of the wide trenches 51c and 51d, and a field oxide film 59 formed on the bottom surface of each of the wide trenches 51c and 51d. The isolation region structure further includes a nitride film 55 formed to cover the entire surface of the portion of oxide film 53 disposed in each of the narrow trenches 51a and 51b, opposite side surfaces of the portion of oxide film 53 disposed in each of the wide trenches 51c and 51d and opposite edges of the portion of oxide film 59 disposed in each of the wide trenches 51c and 51d, a polysilicon film 61 filling the narrow trenches 51a and 51b and the wide trenches 51c and 51d, an oxide film 43 formed over active regions 49, and a field oxide film 65 formed over the polysilicon film 61 to protect the polysilicon film 61.

In this structure of the second embodiment,, the field oxide film 65 is formed to a large thickness on the polysilicon film 61, as compared with the thin oxide film 63 of the first embodiment.

In this structure, the nitride film 55 for an oxidation mask is formed in the trenches to serve as a stress-relief layer.

FIGS. 4A to 4I are sectional views respectively illustrating a method for fabricating the isolation region structure in accordance with the first embodiment of the present invention.

Figure 4A:
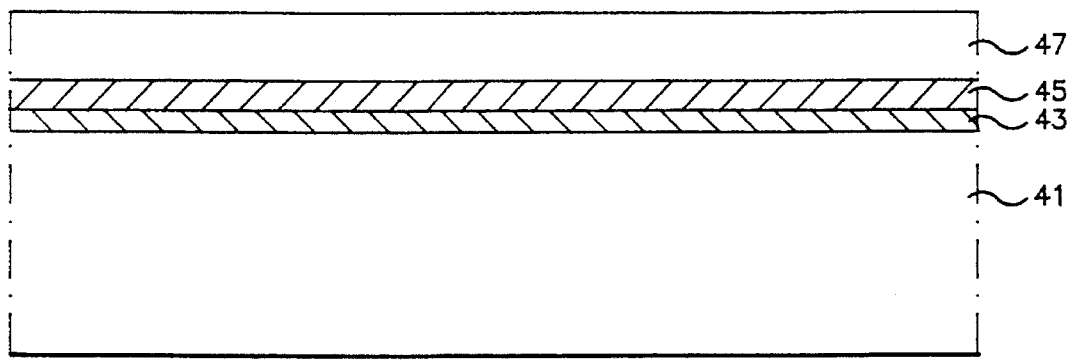
FIGS. 4A to 4I are sectional views respectively illustrating a method for fabricating the isolation region structure of FIG. 2.

In accordance with this method, over a silicon substrate 41 a pad oxide film 43 is formed to a thickness of 100 Å, as shown in FIG. 4A. The pad oxide film 43 serves as a stress-relief layer at a subsequent field oxidation step. Over the pad oxide film 43, a nitride film 45 is deposited to a thickness of 1,500 Å by use of a LPCVD process. The nitride film 45 serves as an oxidation mask at the subsequent field oxidation step. A photoresist film 47 is coated over the nitride film 45.

Figure 4B:
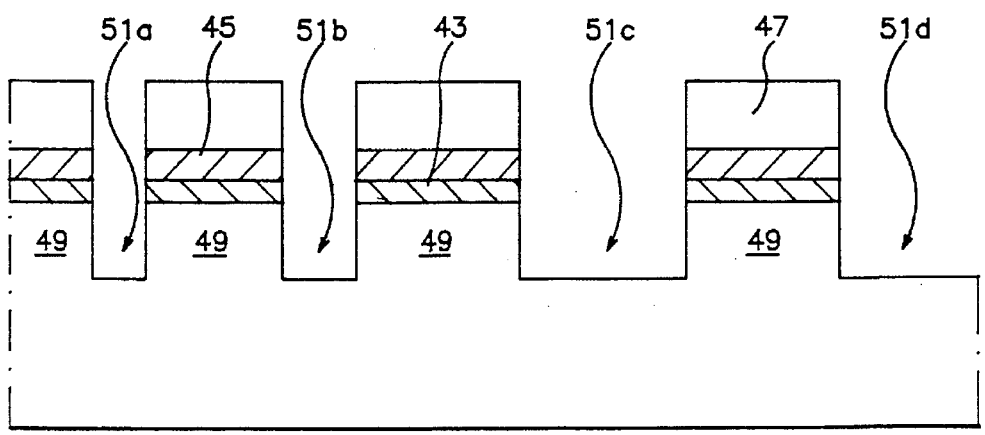

The photoresist film 47 is then patterned for defining active regions 49, as shown in FIG. 4B. Using the patterned photoresist film 47 as a mask, the nitride film 45 and the pad oxide film 43 are subjected to an etching for removing their portions not disposed over the active regions 49. As a result, the silicon substrate 41 is partially exposed through the removed portions of the nitride film 45 and the pad oxide film 43.

Thereafter, the exposed portions of silicon substrate 41 are etched to a depth of 2,000 to 5,000 Å so as to form trenches. As a result, the silicon substrate 41 has a plurality of trenches each disposed between adjacent active regions 49. The trenches include narrow ones 51a and 51b and wide ones 51c and 51d.

Figure 4C:
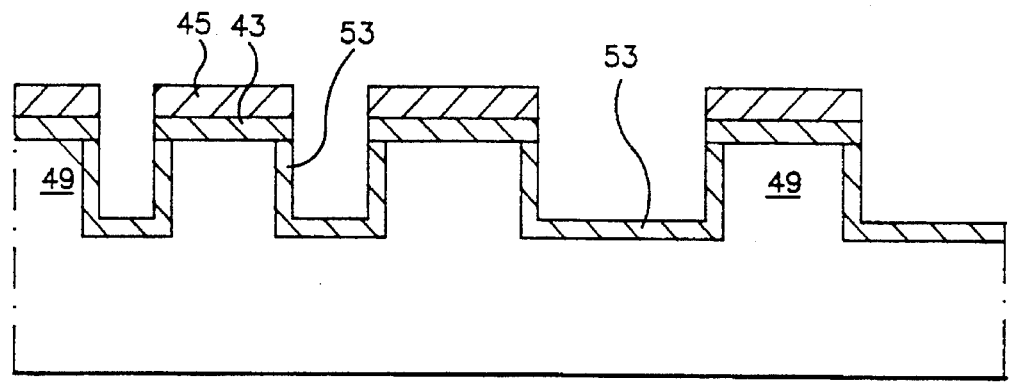

After the formation of trenches, the remaining photoresist film 47 is removed, as shown in FIG. 4C. Then, a second pad oxide film 53 is grown in each trench.

Figure 4D:
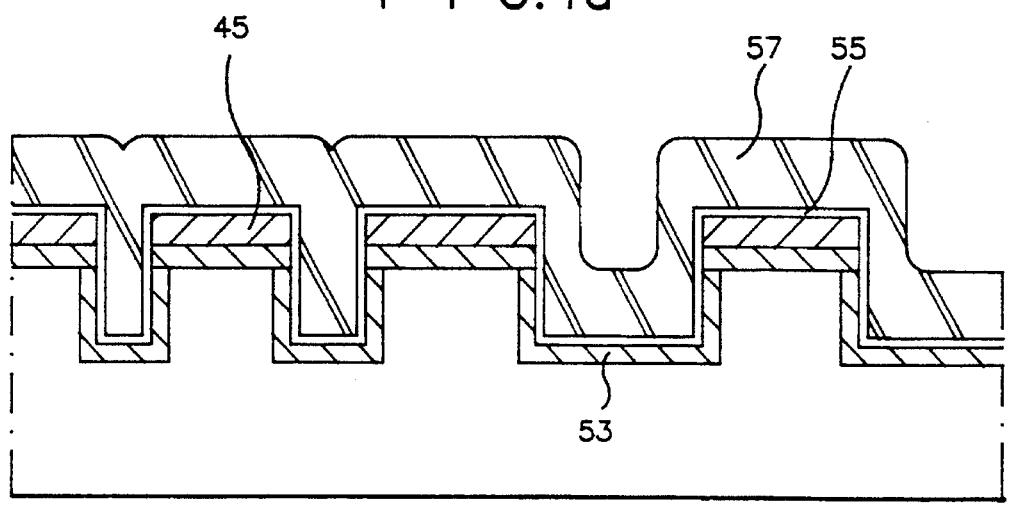

Over the entire exposed surface of the resulting structure, a second nitride film 55 is formed to a thickness of about 300 Å by use of the LPCVD process, as shown in FIG. 4D. A CVD oxide film 57 is then thickly deposited over the second nitride film 55 by use of the CVD process so as to fill the trenches.

Figure 4E:
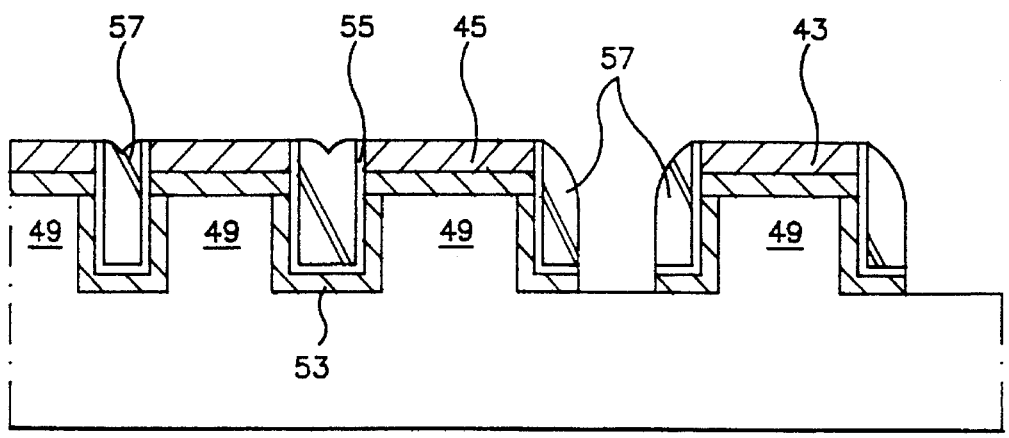

Subsequently, an etchback process step is carried out for etching the CVD oxide film 57, as shown in FIG. 4E. At the etchback process step, a reactive ion etching (RIE) process is used.

In case of the narrow trenches 51a and 51b, the CVD oxide film 57 fills the trenches completely and thus forms a planar surface. By the CVD oxide film 57, the second nitride film 55 is still maintained in the trenches.

On the other hand, in case of the wide trenches 51c and 51d, the CVD oxide film 57 forms spacers in the trenches. At the bottom surface of each trench, the second nitride film 55 and the second pad oxide film 53 are etched, thereby causing the silicon substrate 41 to be partially exposed.

Figure 4F:
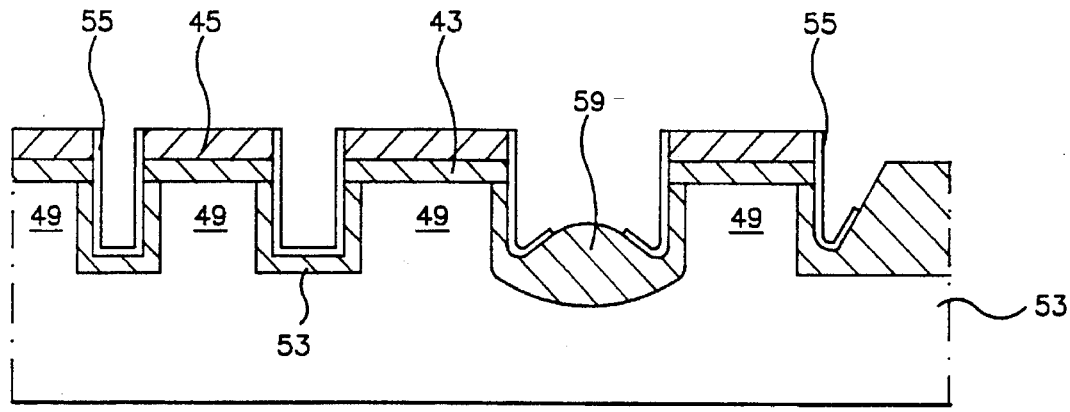

Thereafter, the CVD oxide film 57 formed in the trenches is dipped in an HF solution so as to be completely removed, as shown in FIG. 4F. A field oxidation step is carried out for forming a field oxide film 59. The field oxide film 59 has a thickness of 5,000 Å. The field oxide film 59 is not grown in the narrow trenches 51a and 51b because the nitride film 55 is still maintained in the trenches by virtue of the presence of the CVD oxide film 57, as mentioned above in conjunction with FIG. 4E. However, the field oxide film 59 is grown over the exposed portions of silicon substrate 41 in the wide trenches 51c and 51d under a condition that the nitride film 55 is used as an oxidation mask.

Figure 4G:
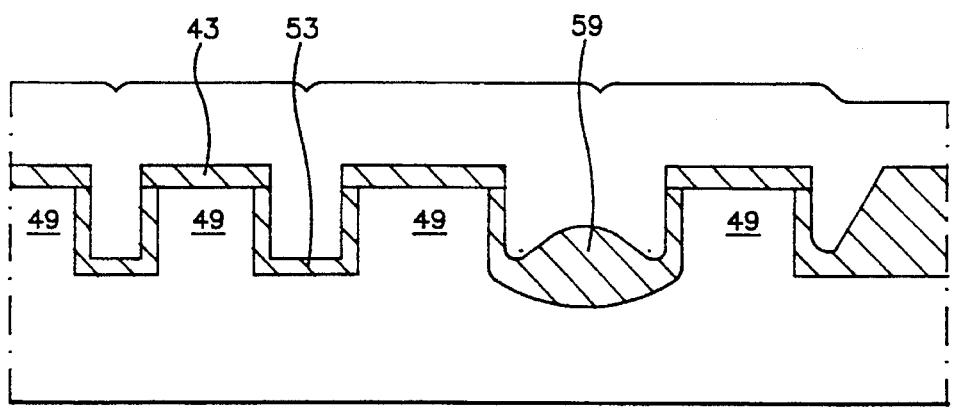

The nitride films 45 and 55 for the oxidation mask are dipped in a hot phosphoric acid ($H_3PO_4$) solution of a temperature of 160° C. so as to be completely removed, as shown in FIG. 4G. A polysilicon film 61 is then deposited over the entire exposed surface of the resulting structure by use of the LPCVD process at a temperature of 550° to 650° C. The polysilicon film 61 has a thickness of 5,000° for filling all the trenches sufficiently and thus providing a planar surface.

Figure 4H:
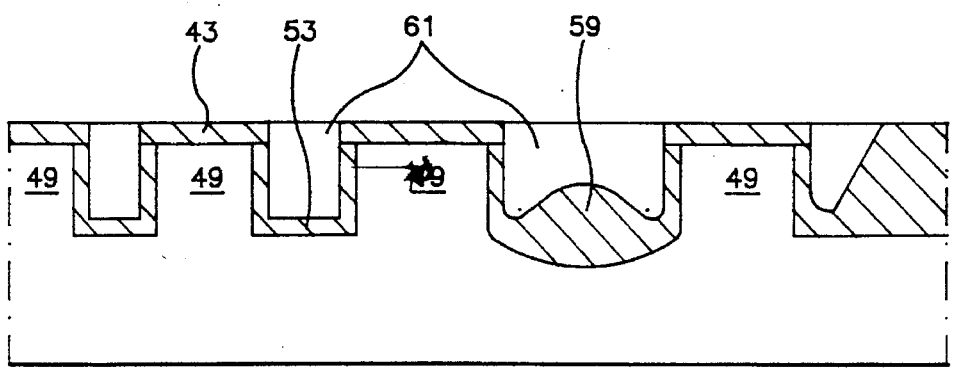

As shown in FIG. 4H, the polysilicon film 61 is then etched back to have a planar surface. At the etchback step, the etch stop end point is determined to expose the first pad oxide film 43.

As a result, the narrow trenches 51a and 51b are filled with the polysilicon film 61 to insulate adjacent active regions 49. On the other hand, the wide trenches 51c and 51d are filled with the field oxide film 59 formed on the bottom surfaces of trenches by use of the LOCOS process and the polysilicon film 61 to insulate adjacent active regions 49.

Figure 4I:
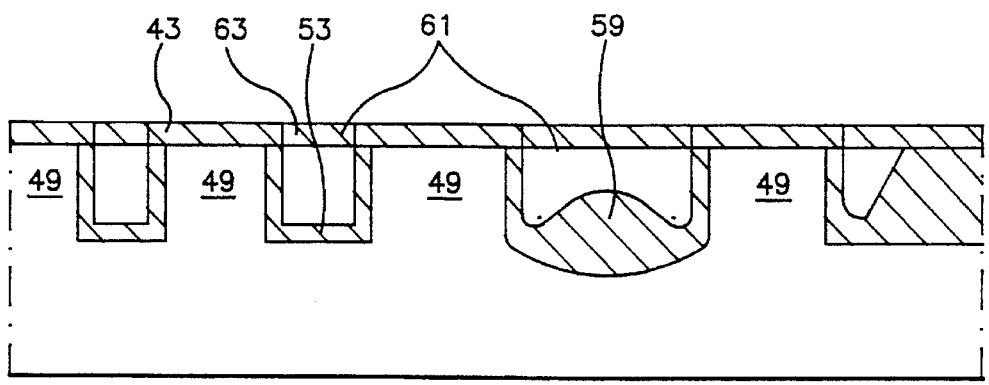

Thereafter, the surface of polysilicon film 61 filling the trenches is subjected to an oxidation for forming a thermal oxide film 63, as shown in FIG. 4I. As a result, the entire surface of silicon substrate 41 is covered with the oxide film. Where the surface of polysilicon film 61 is exposed, a parasitic phenomenon between an interconnection line and a gate line extending along the surface of a device finally produced occurs, thereby resulting in an increase in parasitic capacity or a formation of leakage paths. The thermal oxide film 63 on the polysilicon film 61 serves to make the polysilicon film 63 have a passivation surface for preventing an occurrence of the parasitic phenomenon.

In this embodiment, the thermal oxide film 63 having a small thickness is used as the passivation layer for the polysilicon film 61 filling the trenches.

FIGS. 5A to 5I are sectional views respectively illustrating a method for fabricating the isolation region structure in accordance with the second embodiment of the present invention.

Process steps shown in FIGS. 5A to 5F are identical to the process steps shown in FIGS. 4A to 4F, respectively. In FIGS. 5A to 5I, elements corresponding to those in FIGS. 4A to 4I are denoted by the same reference numerals.

Figure 5A:
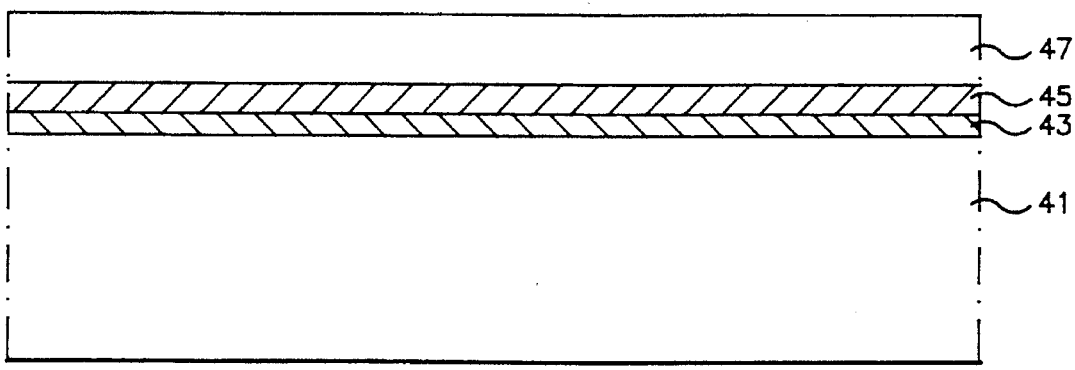
Figure 5B:
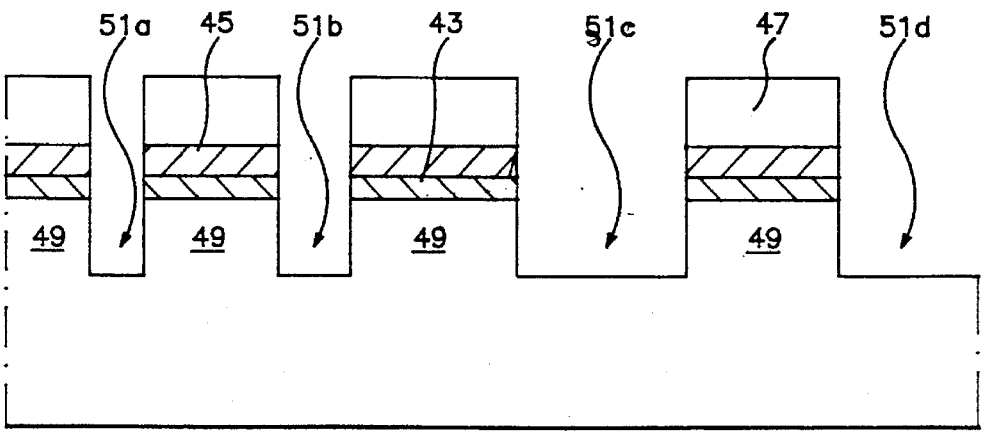
Figure 5C:
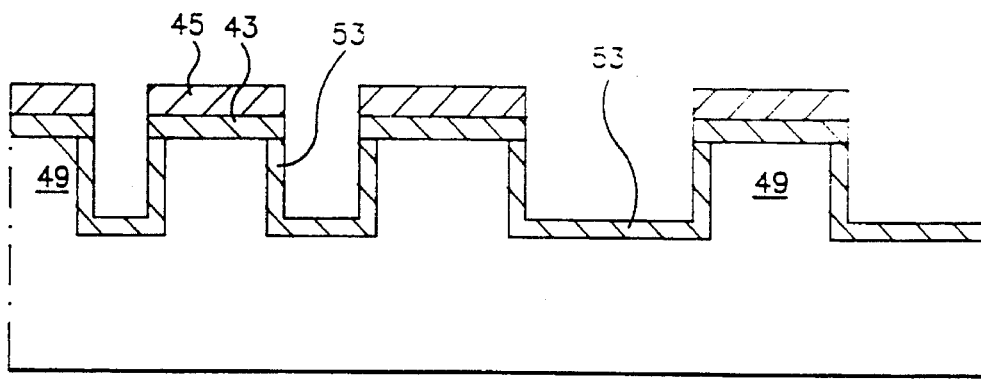
Figure 5D:
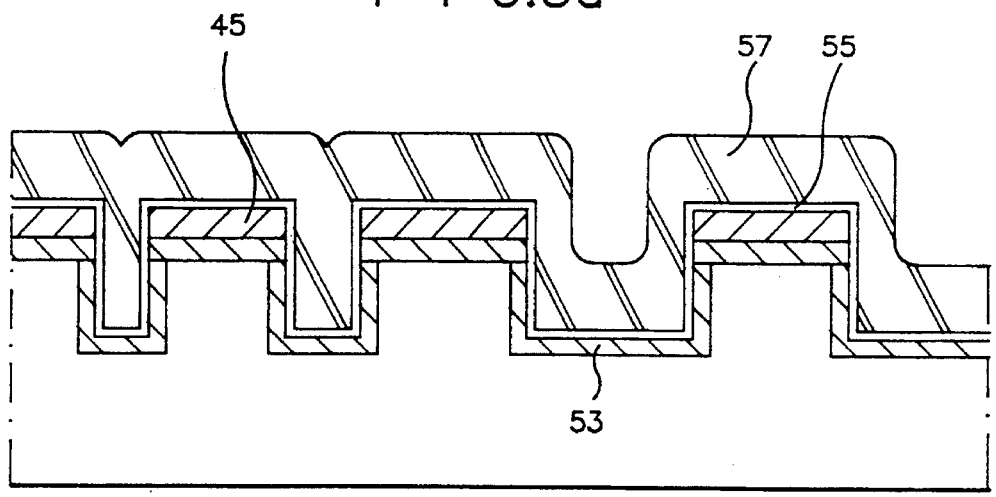
Figure 5E:
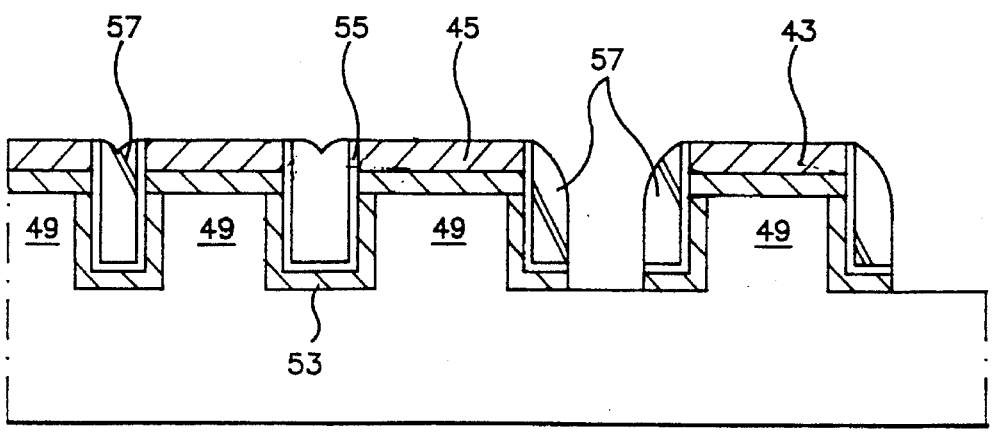
Figure 5F:
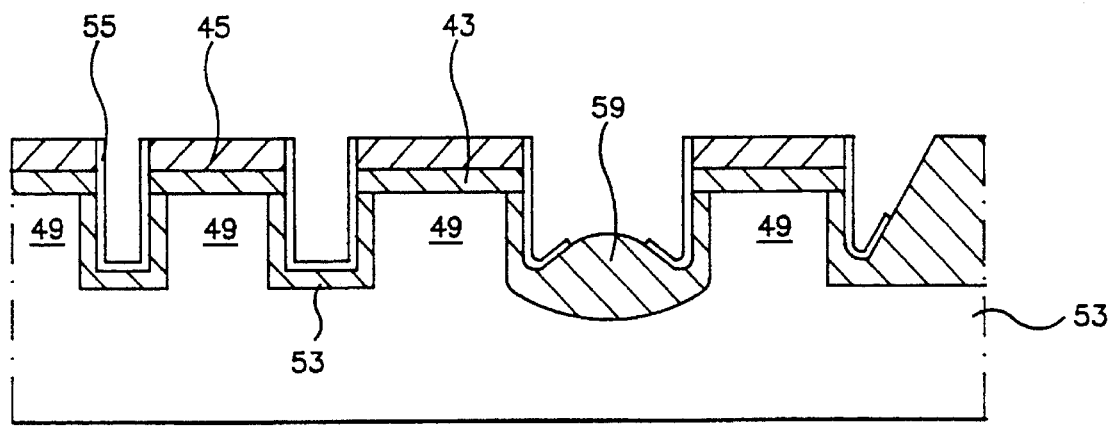
Figure 5G:
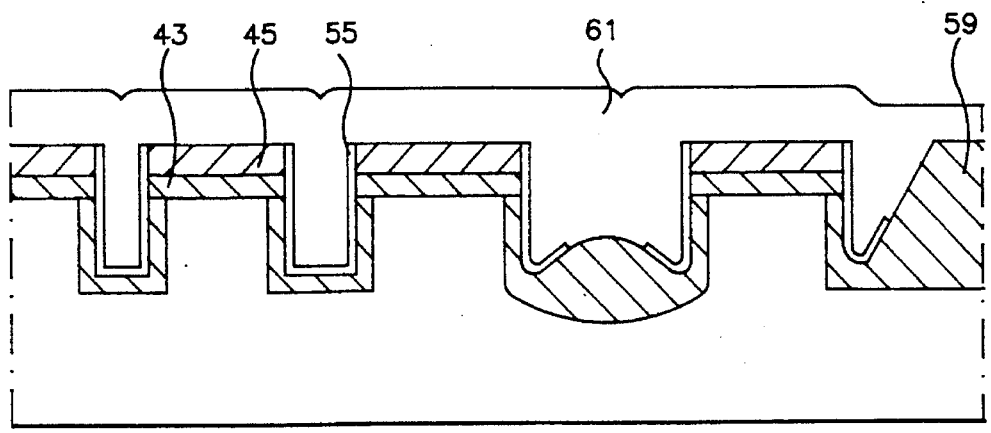

After the formation of field oxide film 59 achieved at the field oxidation step of FIG. 5F, a polysilicon film 61 is deposited over the entire exposed surface of the resulting structure by use of the LPCVD process under a condition that the nitride films 45 and 55 still remain, as shown in FIG. 5G. The polysilicon film 61 is deposited at a temperature of 550° to 650° C. to have a thickness of 5,000° for filling all the trenches sufficiently and thus providing a planar surface.

As shown in FIG. 5H, the polysilicon film 61 is then etched back until the field oxide film 59 is exposed so that it has a planar surface. At the etchback step, the nitride film 55 may be the etch stop end point.

Thereafter, the surface of polysilicon film 61 filling the trenches is subjected to a field oxidation for forming a thick field oxide film 65 capping the polysilicon film 61, as shown in FIG. 5I. At this time, the nitride film 55 is still left in the trenches. As a result, the oxide film 53 and the nitride film 55 serve to relieve a stress generated upon forming the thick field oxide film 65. The capping field oxide film 65 has a thickness of 500 to 3,000 Å.

Finally, the exposed nitride films 45 and 55 are removed in a hot phosphoric acid solution of a temperature of 160° C.

In this embodiment, the field oxide film 65 having a large thickness is used as the passivation layer for the polysilicon film 61.

In accordance with the present invention, the following effects can be obtained.

First, the problem of crystal defect occurring at trench corners can be solved because the polysilicon film is deposited in the trenches at a temperature of 550° to 650° C. lower than that of the conventional method. In accordance with the conventional method, crystal defect occur at lower corners of trenches because the CVD oxide film fills the trenches at a high temperature of 750° to 800° C.

Second, a problem of a stress generated at a heat cycle process step following the formation of isolation regions can be solved because the trenches are filled with the polysilicon film exhibiting the same thermal expansion coefficient as the silicon substrate. In accordance with the conventional method using the CVD oxide film exhibiting the thermal expansion coefficient different from the polysilicon film, a stress is generated at the heat cycle process step, thereby occurring crystal defect.

Third, although the conventional method encounters a problem that the CVD oxide film may be damaged due to an HF solution at a cleaning step following the formation of isolation regions, the present invention solves such a problem by virtue of the use of polysilicon film.

What is claimed is:

1. A method for fabricating an isolation region structure in a semiconductor device, comprising the steps of:

sequentially forming a first pad oxide film and a first nitride film over a silicon substrate;

patterning said first nitride film and said first pad oxide film to expose said silicon substrate at its portion not disposed at active region;

etching said exposed portion of the silicon substrate to form a plurality of trenches including narrow ones and wide ones;

forming a second pad oxide film on a bottom surface and opposite side surfaces of each of said trenches;

forming a second nitride film over the entire exposed surface of the resulting structure;

depositing an oxide film over said second nitride film and etching back said oxide film such that said oxide film remains to fill said narrow trenches and form spacers respectively on side walls of said wide trenches;

removing said second pad oxide film and said second nitride film using said spacer as a mask in the wide trenches;

removing said spacer;

growing a first field oxide film over said exposed portions of the silicon substrate in the wide trenches by use of a primary field oxidation process;

forming a polysilicon film to fill the narrow and wide trenches;

forming a second field oxide film, which is thicker than said first pad oxide film, on said polysilicon film by carrying out a secondary field oxidation process, wherein said first nitride film serves as an oxidation mask; and removing said first nitride film remaining the first pad oxide film at said active regions.

2. A method in accordance with claim 1, wherein said first and second pad oxide films serve as a stress-relief layer at said steps using said primary and secondary field oxidation processes.

3. A method in accordance with claim 1, wherein said first and second nitride films serve as an oxidation mask at said step using said primary and secondary field oxidation processes.

4. A method in accordance with claim 1, wherein said silicon substrate is etched to a depth of 2,000 to 5,000 Å so as to form said trenches.

5. A method in accordance with claim 1, wherein said first field oxide film has a thickness of 5,000 Å.

6. A method in accordance with claim 1, wherein said step of etching back said oxide film is carried out by use of a reactive ion etching process.

7. A method in accordance with claim 1, wherein said polysilicon film is formed by use of a low pressure chemical vapor deposition process at a temperature of 550° to 650° C.

8. A method in accordance with claim 1, wherein said step of etching said polysilicon film is carried out under a condition that said first field oxide film is used as an etching stop end point.

9. A method in accordance with claim 1, wherein said step of etching said polysilicon film is carried out under a condition that said first nitride film is used as an etching stop end point.

10. A method in accordance with claim 1, wherein said second field oxide film has a thickness of 500 to 3,000 Å.

11. A method for fabricating an isolation region structure in a semiconductor device, comprising the steps of:

(a) sequentially forming a first pad oxide film and a first nitride film over a silicon substrate;

(b) patterning the first nitride film and the first pad oxide film to expose the silicon substrate at a portion thereof spaced from active regions thereof;

(c) etching the exposed portion of the silicon substrate to form a plurality of narrow trenches and a plurality of wide trenches;

(d) forming a second pad oxide film on a bottom surface and opposite side surfaces of each of the trenches;

(e) forming a second nitride film over the entire exposed surface of the resulting structure;

(f) depositing an oxide film over the second nitride film;

(g) etching back the oxide film such that the oxide film remains filling the narrow trenches and forming spacers on sidewalls of the wide trenches;

(h) using the spacer as a mask, removing the second pad oxide film and the second nitride film in the wide trenches;

(i) removing the spacer;

(j) growing a first field oxide film over exposed portions of the silicon substrate in the wide trenches using a primary field oxidation process;

(k) forming a polysilicon film to thereby fill the narrow and wide trenches;

(l) forming a second field oxide film, which is thicker than the first pad oxide film, on the polysilicon film using a secondary field oxidation process, with the first nitride film serving as an oxidation mask; and (m) removing the first nitride film remaining on the first pad oxide film at the active regions.

* * * * *